United States Patent
Takayasu et al.

(10) Patent No.: US 7,718,269 B2
(45) Date of Patent: May 18, 2010

(54) SEMICONDUCTOR MANUFACTURING METHOD FOR INTER-LAYER INSULATING FILM

(75) Inventors: Masami Takayasu, Hitachinaka (JP); Katsuhiko Hotta, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 1070 days.

(21) Appl. No.: 11/374,075

(22) Filed: Mar. 14, 2006

(65) Prior Publication Data

US 2006/0204673 A1    Sep. 14, 2006

(30) Foreign Application Priority Data

Mar. 14, 2005    (JP)    ............... 2005-070788

(51) Int. Cl.
*B32B 15/08*    (2006.01)
(52) U.S. Cl. .................. 428/450; 427/489; 438/788
(58) Field of Classification Search .......... 428/450; 427/489; 438/788
See application file for complete search history.

(56) References Cited

U.S. PATENT DOCUMENTS

| | | | |
|---|---|---|---|
| 6,583,048 B1 | 6/2003 | Vincent et al. | |
| 6,949,830 B2 | 9/2005 | Owada et al. | |
| 2001/0005546 A1 | 6/2001 | Cheung et al. | |
| 2004/0084777 A1 | 5/2004 | Yamanoue et al. | |
| 2004/0152334 A1 | 8/2004 | Ohto et al. | |
| 2004/0192032 A1 | 9/2004 | Ohmori et al. | |
| 2005/0048797 A1* | 3/2005 | Fukazawa et al. ........... 438/778 |

FOREIGN PATENT DOCUMENTS

| | | |
|---|---|---|
| JP | 2002-503879 | 2/2002 |
| JP | 2002-256434 | 9/2002 |
| JP | 2003-124307 | 4/2003 |
| JP | 2004-111688 | 4/2004 |
| JP | 2004-153015 | 5/2004 |
| JP | 2004-158832 | 6/2004 |
| JP | 2004-172590 | 6/2004 |
| JP | 2004-221275 | 8/2004 |

* cited by examiner

*Primary Examiner*—Kuo-Liang Peng
(74) *Attorney, Agent, or Firm*—Antonelli, Terry, Stout & Kraus, LLP.

(57) ABSTRACT

Provided is a technology capable of improving the reliability of a semiconductor device using a SiOC film as an interlayer film. In the invention, by forming an interlayer film from a SiOC film having a Si—$CH_3$ bond/Si—O bond ratio less than 2.50% or having a strength ratio determined by the FT-IR of a Si—OH bond to a SiO—O bond exceeding 0.0007, a strength ratio of a SiH bond to a SiO—O bond at a wavelength of 2230 $cm^{-1}$ exceeding 0.0050 and a strength ratio of a Si—H bond to a SiO—O bond at a wavelength of 2170 $cm^{-1}$ exceeding 0.0067, the interlayer film has a relative dielectric constant of to 3 or less, and owing to suppression of lowering in hardness or elastic modulus, has improved mechanical strength.

10 Claims, 11 Drawing Sheets

| Si-CH3/Si-O BOND RATIO (%) | 2.30 | 2.40 | 2.50 | 2.55 | 2.90 |
|---|---|---|---|---|---|
| TAPE PHOTOGRAPH | DELAMINATION | DELAMINATION | DELAMINATION | DELAMINATION | DELAMINATION |

SAMPLE STRUCTURE

SEMICONDUCTOR MANUFACTURING METHOD FOR INTER-LAYER INSULATING FILM

CROSS-REFERENCE TO RELATED APPLICATION

The present application claims priority from Japanese patent application No. 2005-070788 filed on Mar. 14, 2005, the content of which is hereby incorporated by reference into this application.

BACKGROUND OF THE INVENTION

The present invention relates to a manufacturing technology of a semiconductor device, particularly to a technology effective when applied to the manufacture of a semiconductor device having an insulating film disposed to electrically isolate a semiconductor element from a wiring or two vertically adjacent wirings.

An organic insulating film composed of SiOH, SiCNH or SiCH formed using, as a raw material, an organic silane having at least a C/Si ratio of 5 or greater and a molecular weight of 100 or greater; and a semiconductor device using the organic insulating film, particularly, the semiconductor device having a trench structure are described in Japanese Unexamined Patent Publication No. 2004-221275.

A method of reacting one or more carbon-containing silicon compound with an oxidizing gas at a constant RF power level of about 10 W to about 200 W, or a pulse RF power level of about 20 W to about 500 W to deposit a film of a low dielectric constant, and an apparatus therefor are disclosed in Japanese Unexamined Patent Publication No. 2002-503879.

A semiconductor device equipped with a carbon-containing silicon oxide film formed over a substrate, a metal wiring buried in the carbon-containing silicon oxide film, and an insulating film formed over the carbon-containing silicon oxide film and metal wiring, wherein the carbon-containing silicon oxide film has a surface layer having a carbon concentration of 1 atm % or less and a depth of 50 nm from the uppermost surface is disclosed in Japanese Unexamined Patent Publication No. 2003-124307.

A manufacturing method of a semiconductor device which comprises preparing an underground structure having a silicon carbide layer covering therewith a copper wiring, and causing silicon oxycarbide to grow by vapor deposition while using, as a source gas, tetramethylcyclotetrasiloxane, a carbon dioxide gas, and oxygen having a flow rate of 3% or less relative to the flow rate of the carbon dioxide gas, wherein the silicon oxycarbide contains hydrogen and has a carbon content of 18 at % or greater and a relative dielectric constant of 3.1 or less is disclosed in Japanese Unexamined Patent Publication No. 2004-172590.

A technology of reacting, under conditions of chemical vapor deposition enough for causing growth of a film over a substrate, an organic silicon precursor containing silyl ether, silyl ether oligomer or an organic silicon compound having one or more reactive group to form an interlayer insulating film having a dielectric constant of about 3.5 or less is disclosed in Japanese Unexamined Patent Publication No. 2002-256434.

SUMMARY OF THE INVENTION

In order to control wiring delay owing to miniaturization of a semiconductor device, wiring resistance and wiring capacitance are reduced. Proper designing technology and adoption of a wiring having copper as a main conductor layer are considered in order to reduce the wiring resistance. For the formation of a copper wiring, employed is the so-called damascene process, a process of forming a wiring pattern inside of a trench by depositing a wiring metal having copper as a main conductor layer over a substrate including the inside of the trench formed in an insulating film and then removing an unnecessary portion of the wiring metal from a region other than the trench by CMP (Chemical Mechanical Polishing).

With regards to the wiring capacitance, adoption of a low dielectric material having a relative dielectric constant of about 2 to 3, which is relatively low, for an interlayer insulating film is being considered. Among various materials, a carbon-containing silicon oxide film (Silicon-oxycarbide: which will hereinafter be abbreviated as SiOC) having excellent mechanical strength is expected to be promising as a low dielectric material.

Manufacture of a damascene wiring structure adopting a SiOC film as an interlayer film, however, has various technical problems as described below.

It has been elucidated that a relative increase in the amount of C contained in a SiOC film for the purpose of a further reduction of wiring capacitance lowers the mechanical strength of the SiOC film. As described above, a wiring is formed inside of a trench by depositing a wiring metal over a substrate including the inside of the trench and then removing an unnecessary portion of the wiring metal from a region other than the trench by CMP. Lowering in the mechanical strength of the SiOC film causes inconveniences such as boring of the SiOC film when the wiring metal film is polished by CMP or delamination at an interface between the SiOC film and another insulating film stacked thereover, which leads to a reduction in the production yield of the semiconductor device. When the semiconductor wafer is diced into individual chips after substantial completion of the formation of circuit patterns on a semiconductor wafer, cracks appear in the SiOC film or delamination appears at the interface between the SiOC film and another insulating film stacked thereover.

An object of the present invention is to provide a technology capable of improving the reliability of a semiconductor device having a SiOC film as an interlayer film.

The above-described and the other objects and novel features of the present invention will be apparent from the description herein and accompanying drawings.

Outlines of the representative invention, of the inventions disclosed by the present application, will next be described.

In the present invention, there is thus provided a manufacturing method of a semiconductor device which comprises forming, from a SiOC film, an interlayer film for electrically isolating two vertically or horizontally adjacent wirings, wherein a Si—$CH_3$ bond/S—O bond ratio as determined by FT-IR is adjusted to less than 2.50.

Advantages available from the typical invention, of the inventions disclosed by the present application, will be described below briefly.

By preventing lowering in the mechanical strength of a SiOC film, a semiconductor device using the SiOC film as an interlayer film has improved reliability.

DETAILED DESCRIPTION OF THE INVENTION

Figure 1:
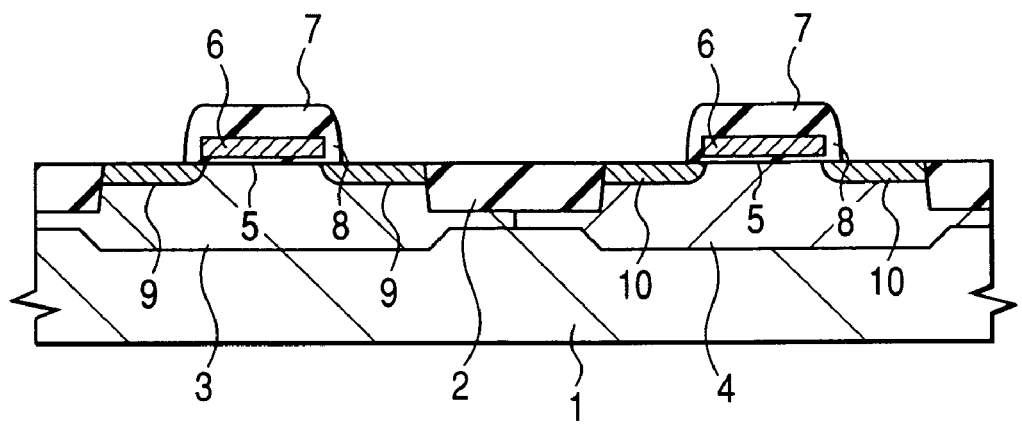
FIG. 1 is a fragmentary cross-sectional view of a semiconductor substrate illustrating a manufacturing step of a CMOS device according to a first embodiment of the present invention.

In the below-described embodiment, when a reference is made to the number of elements (including the number, value, amount and range), the number is not limited to a specific number but can be greater than or less than the specific number unless otherwise specifically indicated or it is principally apparent that the number is limited to the specific number. Moreover in the below-described embodiment, it is needless to say that the constituting elements (including element steps) are not always essential unless otherwise specifically indicated or it is principally apparent that they are essential. Similarly, in the below-described embodiment, when a reference is made to the shape or positional relationship of the constituting elements, that substantially analogous or similar to it is also embraced unless otherwise specifically indicated or it is principally apparent that it is not. This also applies to the above-described value and range.

In the embodiment, MISFET which is a typical example of a field effect transistor is abbreviated as MIS, a p channel type MISFET is abbreviated as PMIS and an n channel type MISFET is abbreviated as nMIS.

In all the drawings for describing the embodiment, like members of a function will be identified by like reference numerals and overlapping descriptions will be omitted. The embodiment of the present invention will hereinafter be described in detail based on accompanying drawings.

In the first embodiment of the present invention, application of the present invention to a manufacturing method of a CMOS (Complementary Metal Oxide Semiconductor) device will be described referring to FIGS. 1 to 18.

As illustrated in FIG. 1, a semiconductor substrate 1 (a semiconductor wafer processed into a thin disc plate) made of, for example, a p type silicon single crystal is prepared. An element isolation portion 2 is formed on the main surface of the semiconductor substrate 1. With a resist pattern formed by photolithography as a mask, an impurity ion is implanted into the semiconductor substrate 1 to form a p well 3 and an n well 4. An impurity showing a p type conductivity, for example, boron is ion-implanted into the p well 3, while an impurity showing an n type conductivity, for example, phosphorus is ion-implanted into the n well 4. Then, another impurity for controlling the threshold value of MIS may be ion-implanted into each well region.

After formation of a film stack by depositing a silicon oxide film, a polycrystalline silicon film and a silicon oxide film successively, the film stack is etched with a resist pattern formed by photolithography as a mask, whereby a gate insulating film 5 made of the silicon oxide film, a gate electrode 6 made of the polycrystalline silicon film and a cap insulating film 7 made of the silicon oxide film are formed. Over the semiconductor substrate 1, a silicon oxide film is then deposited, for example, by CVD (Chemical Vapor Deposition), followed by anisotropic etching of this silicon oxide film to form sidewalls 8 over the side surfaces of the gate electrode 6.

With a resist pattern formed by photolithography as a mask, an n type impurity, for example, arsenic is ion-implanted into the p well 3 to form n type semiconductor regions 9 in the p wells 3 on both sides of the gate electrode 6. The n type semiconductor regions 9 are formed in self alignment with the gate electrode 6 and sidewalls 8 and they serve as source and drain of nMIS. Similarly, with a resist pattern formed by photolithography as a mask, a p type impurity, for example, boron fluoride is ion-implanted into the n well 4 to form p type semiconductor regions 10 in the n wells 4 on both sides of the gate electrode 6. The p type semiconductor regions 10 are formed in self alignment with the gate electrode 6 and sidewalls 8 and they serve as source and drain of PMIS.

Figure 2:
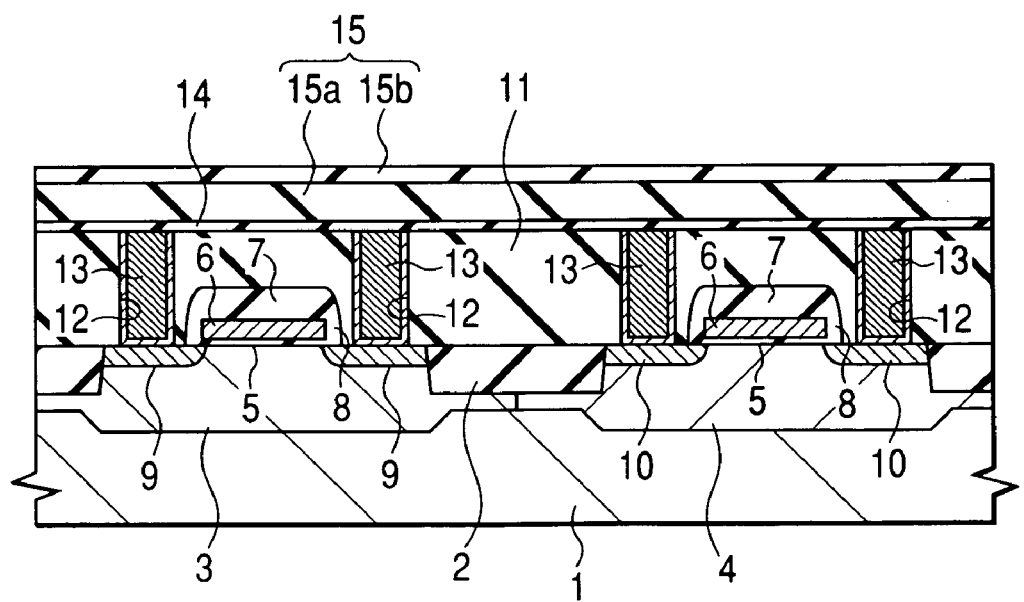
FIG. 2 is a fragmentary cross-sectional view of a semiconductor substrate illustrating a manufacturing step of a CMOS device according to the first embodiment of the present invention.

As illustrated in FIG. 2, after formation of a silicon oxide film over the semiconductor substrate 1, for example, by sputtering or CVD, the resulting silicon oxide film is polished, for example, by CMP to form an interlayer insulating film 11 having a planarized surface. By etching with a resist pattern formed by photolithography as a mask, a connecting hole 12 is formed in the interlayer insulating film 11. This connecting hole 12 is formed in necessary portions over the n type semiconductor regions 9 or p type semiconductor regions 10.

On the entire surface of the semiconductor substrate 1 including the inside of the connecting hole 12, a titanium nitride film is formed, for example, by CVD and a tungsten film to fill the connecting hole 12 is formed, for example, by CVD. The titanium nitride film and tungsten film in a region other than the connecting hole 12 is removed, for example, by CMP to form a plug 13 inside of the connecting hole 12.

By the single damascene method, a first-level wiring is then formed. First, a stopper insulating film 14 is formed over the plug 13, followed by the formation of an insulating film (which will hereinafter be called "an interlayer dielectric film") 15 in which a wiring is to be formed. The etching stopper film 14 is a film serving as an etching stopper when a wiring trench is formed in the interlayer dielectric film 15 and it is formed by a material having an etching selectivity sufficiently different from that of the interlayer dielectric film 15. The stopper insulating film 14 is, for example, a silicon carbide (which will hereinafter be abbreviated as "SiC") film, a silicon nitride (which will hereinafter be abbreviated as "SiN") film or a nitrogen-containing silicon carbide (which will hereinafter be abbreviated as "SiCN") film and has a thickness of about 5 nm. The interlayer dielectric film 15 is made of a film stack obtained by stacking a SiOC film 15a and a TEOS (Tetraethoxysilane: $Si(OC_2H_5)_4$) film 15b one after another in the order of mention. The SiOC film 15a is about 500 nm thick, while the TEOS film 15b is about 50 nm thick. The TEOS film 15b functions as a sacrificial film when a copper film to be formed over the semiconductor substrate 1 is polished in the later step.

In this embodiment, SiOC films are analyzed by FT-IR (Fourier Transform Infrared Spectrometer) and of them, a SiOC film having a ratio of a Si—$CH_3$ bond to a Si—O bond (which will hereinafter be called "a Si—$CH_3$/Si—O bond ratio", which is available from the spectrum waveform of the FT-IR" less than 2.50% is used as the interlayer dielectric film 15.

Figure 3:
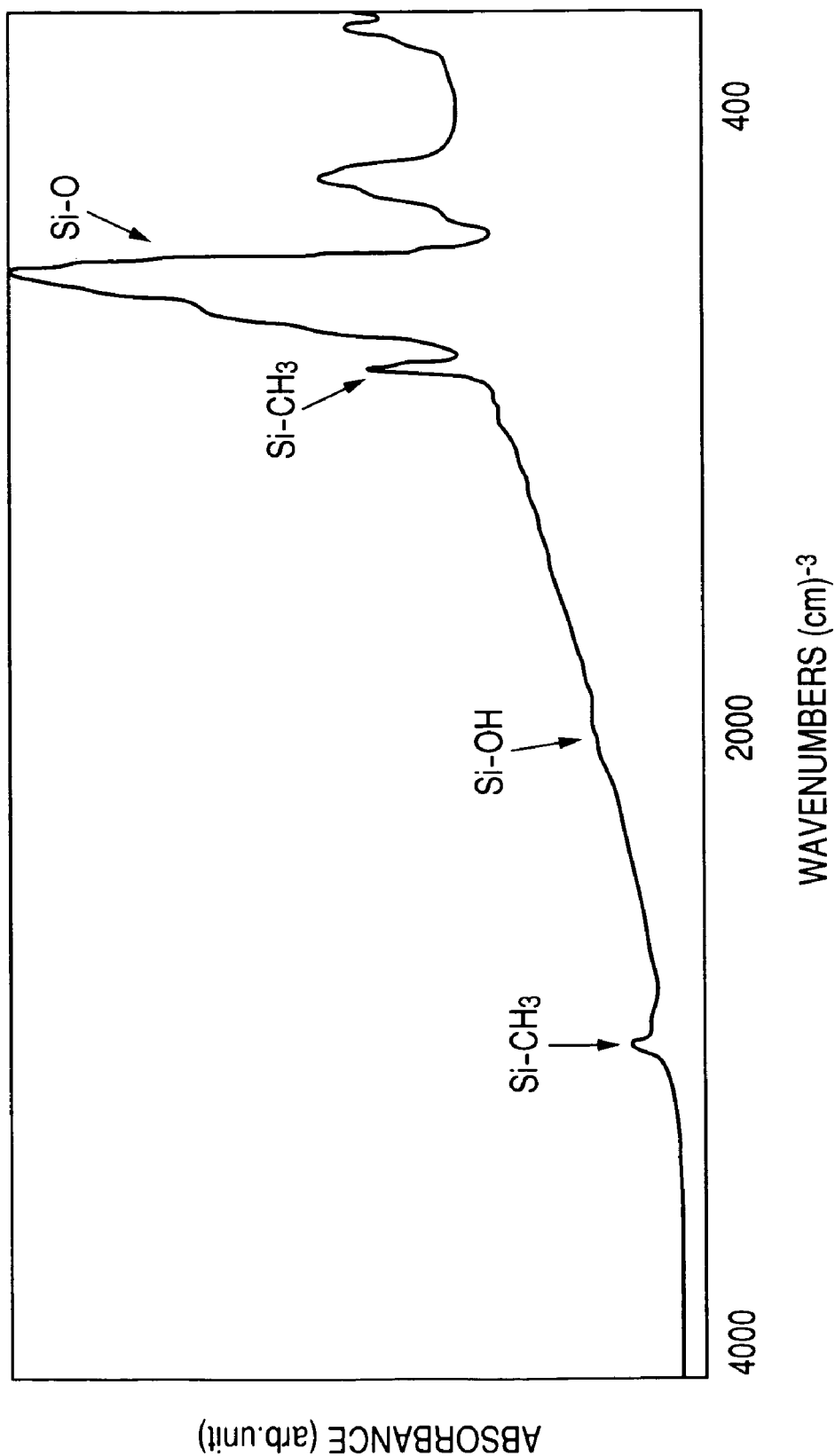
FIG. 3 is a waveform diagram illustrating one example a spectrum waveform of a SiOC film determined by FT-IR according to the first embodiment of the present invention.

FIG. 3 shows one example of a spectral waveform of a SiOC film obtained by FT-IR.

The Si—$CH_3$/Si—O bond ratio of a SiOC film in this embodiment can be determined by measuring a Si—$CH_3$ peak area and a Si—O peak area from the spectral waveform as shown in FIG. 3 and these peak areas are assigned in the equation (1).

$$\text{Si—}CH_3/\text{SiO bond ratio (\%)} = (\text{Si—}CH_3 \text{ peak area} \div \text{Si—O peak area}) \times 100 \quad (1)$$

Figure 4:
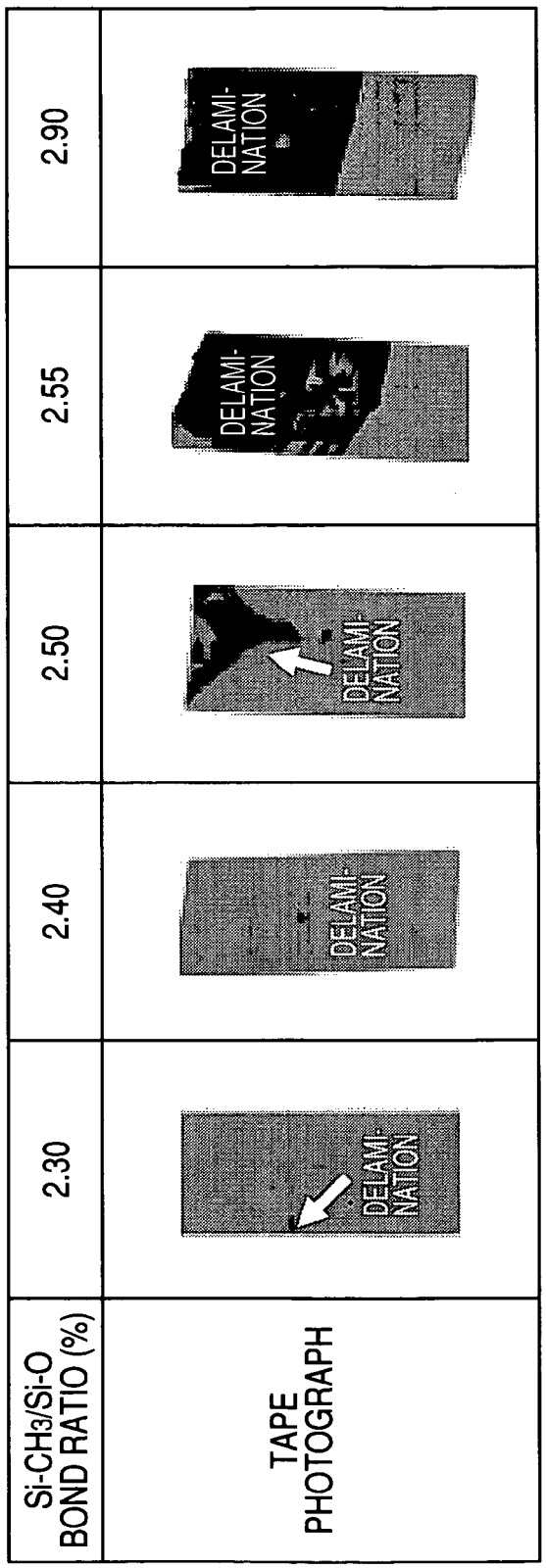
FIG. 4 is a schematic view illustrating the results of a tape test of a SiOC film according to the first embodiment of the present invention.
Figure 4:
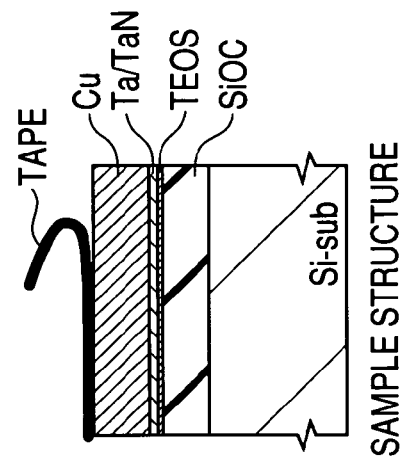

FIG. 4 shows the results of a tape test of SIOC films. For the tape test, five SiOC films having a Si—$CH_3$/Si—O bond ratio of 2.30%, 2.40%, 2.50%, 2.55% and 2.90% were used. A tape load was 220 g/cm and samples employed for the measurement each had a film stack structure obtained by stacking over a semiconductor substrate a SiOC film (500 nm thick), a TEOS film (50 nm thick), a Ta/TaN film stack (100 nm thick) and a Cu film (from 600 to 700 nm thick) in the order of mention.

Delamination was not observed from the samples including the SiOC films having a Si—$CH_3$/Si—O bond ratio of 2.30% and 2.40%, respectively, while delamination occurred at the interface between the SiOC film and TEOS film in the samples including the SiOC films having a Si—$CH_3$/Si—O bond ratio of 2.50%, 2.55% and 2.90%, respectively.

Figure 5:
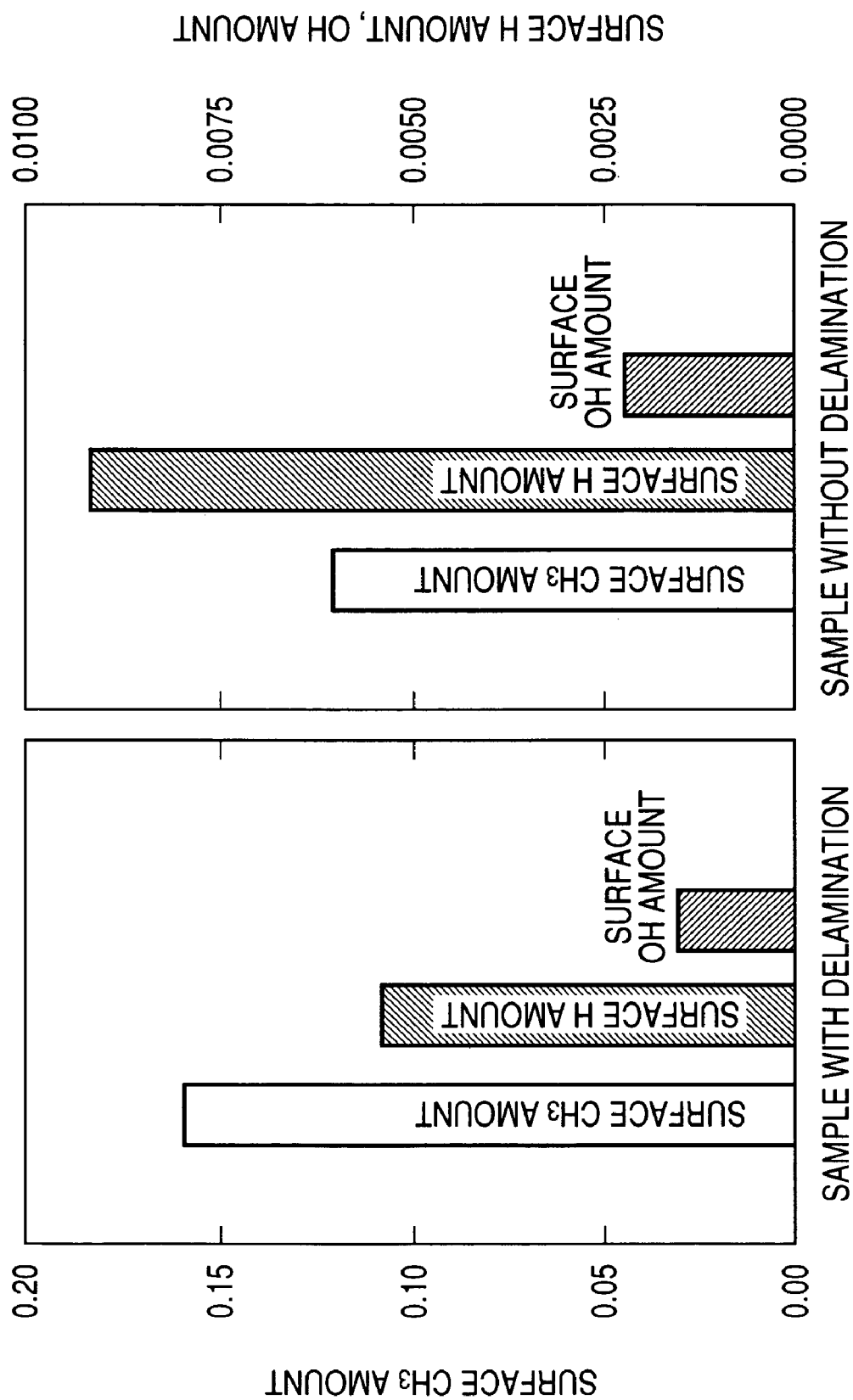
FIG. 5 is a graph illustrating the studied results of the surface state of a SiOC film according to the first embodiment of the present invention.

FIG. 5 shows the study results of the surface state of each of the SiOC films used for the samples (samples with delamination) which have caused delamination and samples (samples without delamination) which have caused no delamination in the above-described tape test.

In the samples which have caused no delamination, an H amount and an OH amount on the surface of the SiOC film are relatively large and a $CH_3$ amount is relatively small, suggesting that a ratio of molecules terminated with $CH_3$ is relatively small on the surface of the SiOC film. In the samples which have caused delamination, an H amount and an OH amount on the surface of the SiOC film are relatively small, while a $CH_3$ amount is relatively large, suggesting that a ratio of termination with $CH_3$ is relatively large on the surface of the SiOC film. In a SiOC film having a relatively small ratio of termination with $CH_3$, that is, a SiOC film having a Si—$CH_3$/Si—O bond ratio less than 2.50%, a molecular structure terminated with O or H enhances an interatomic bond at the interface, thereby improving the adhesion with a film deposited thereover.

Figure 6:
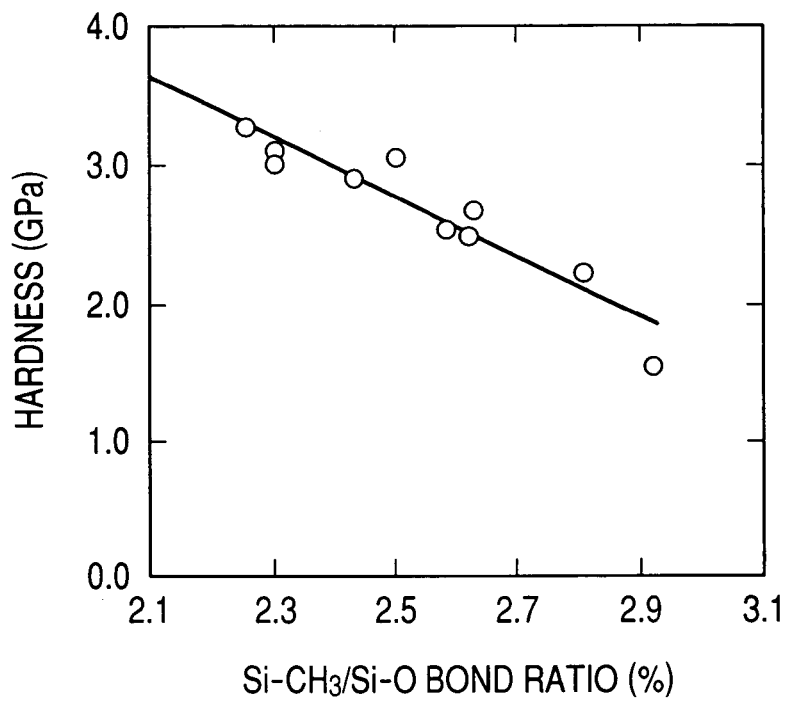
FIG. 6 is a graph illustrating the relationship between the hardness and Si—CH$_3$/Si—O bond ratio of a SiOC film according to the first embodiment of the present invention.
Figure 7:
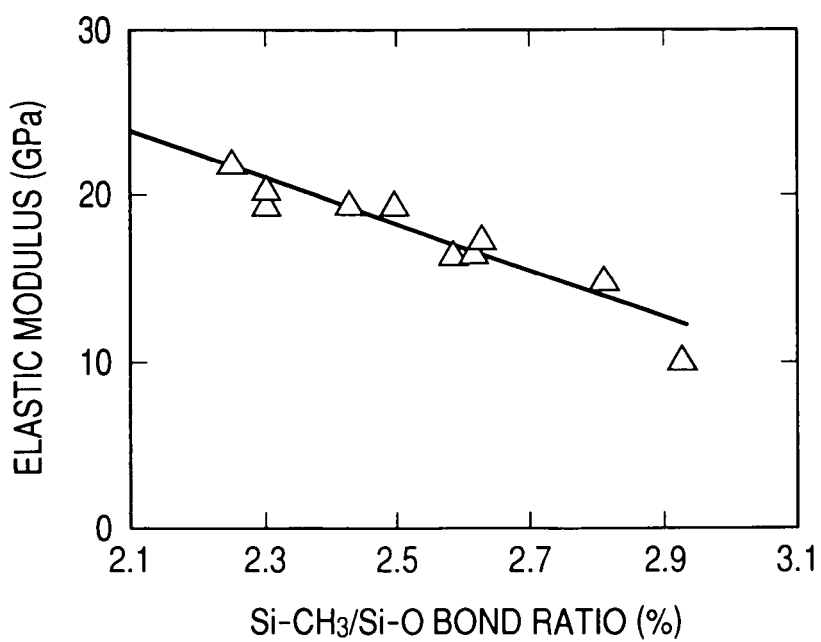
FIG. 7 is a graph illustrating the relationship between the elastic modulus and Si—CH$_3$/Si—O bond ratio of a SiOC film according to the first embodiment of the present invention.

FIG. 6 shows the relationship between the hardness and a Si—$CH_3$/Si—O bond ratio of a SiOC film, while FIG. 7 shows the relationship between the elastic modulus and a Si—$CH_3$/Si—O bond ratio of a SiOC film.

With a decrease in the Si—$CH_3$/Si—O bond ratio, the hardness and elastic modulus show an increase. At Si—$CH_3$/Si—O bond ratios less than 2.50%, the hardness becomes about 2.8 Gpa or greater and elastic modulus becomes about 18 Gpa or greater. This phenomenon is presumed to occur because as a $CH_3$ amount decreases, voids in the SiOC film decrease and the film becomes dense.

As described above, adjustment of the Si—$CH_3$/Si—O bond ratio of a SiOC film to less than 2.50% improves adhesion between the SiOC film and a film deposited thereover (or therebelow) and moreover, improves the strength and elastic modulus of the SiOC film. Adjustment of the Si—$CH_3$/Si—O bond ratio to less than 2.50%, on the other hand, causes a relative increase in the dielectric constant of the SiOC film and wipes out the advantage of adoption of the SiOC film as the interlayer dielectric film 15. For example, a SiOC film having a Si—$CH_3$/Si—O bond ratio of 2.90% has a relative dielectric constant of about 2.7, but a SiOC film having a Si—$CH_3$/Si—O bond ratio of 2.40% has a relative dielectric constant of about 2.90 to 3.0. Judging from them, SiOC films having a Si—$CH_3$/Si—O bond ratio falling within a range of 2.05 to 2.49% (however, not limited by this range, depending on the other conditions) are preferred, with those within a range of 2.30 to 2.40% being most suited.

Figure 8:
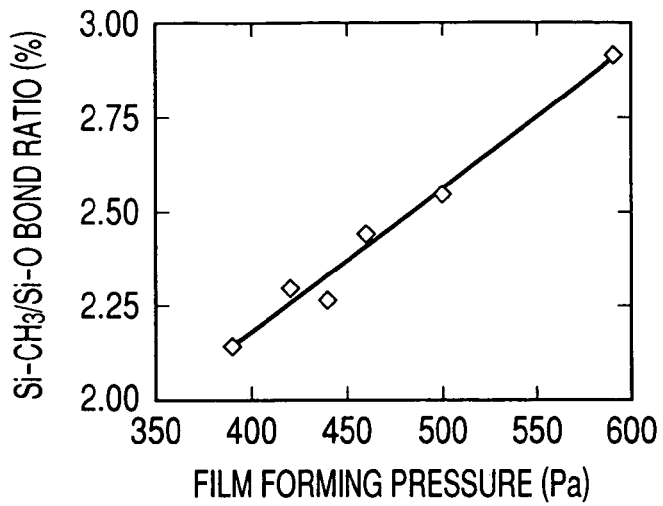
FIG. 8 is a graph illustrating the relationship between the Si—CH$_3$/Si—O bond ratio and film forming pressure according to the first embodiment of the present invention.
Figure 9:
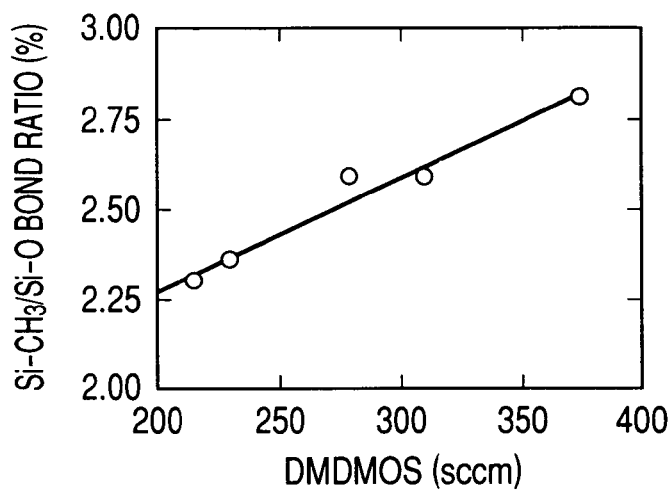
FIG. 9 is a graph illustrating the relationship between the Si—CH$_3$/Si—O bond ratio and DMDMOS flow rate according to the first embodiment of the present invention.
Figure 10:
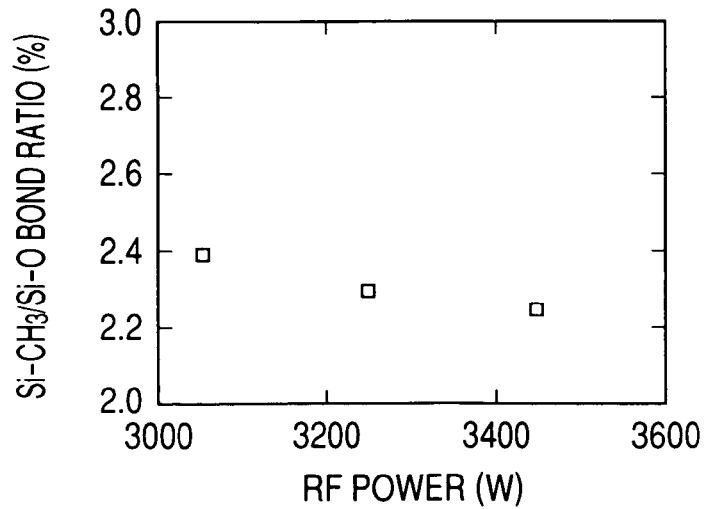
FIG. 10 is a graph illustrating the relationship between the Si—CH$_3$/Si—O bond ratio and RF power according to the first embodiment of the present invention.

A SiOC film is prepared, for example, by plasma CVD. The $CH_3$ amount in the SiOC film varies, depending on the film forming conditions such as film forming pressure, DMDMOS(Dimethyldimethoxysilane: $Si(OCH_3)_2(CH_3)_2$) flow rate, He flow rate, RF power and substrate temperature. In FIGS. 8 to 10, the relationship between a Si—$CH_3$/Si—O bond ratio and each of various film forming conditions is shown. FIG. 8 is a graph showing the relationship between a Si—$CH_3$/Si—O bond ratio and film forming pressure; FIG. 9 is a graph showing the relationship between a Si—$CH_3$/Si—O bond ratio and a DMDMOS flow rate; and FIG. 10 is a graph showing the relationship between a Si—$CH_3$/Si—O bond ratio and RF power.

With an increase in the film forming pressure or DMDMOS flow rate, the Si—$CH_3$/Si—O bond ratio increases. With an increase in the RF power, the Si—$CH_3$/Si—O bond ratio decreases. Thus, according to the film forming conditions, the Si—$CH_3$/Si—O bond ratio of a SiOC film changes. Film forming conditions, for example, pressure of 400 to 600

Pa, DMDMOS flow rate of 200 to 350 sccm, He flow rate of 100 to 200 sccm, RF power of 3000 to 4000 W and substrate temperature of 350 to 400° C. are appropriate.

Figure 11:
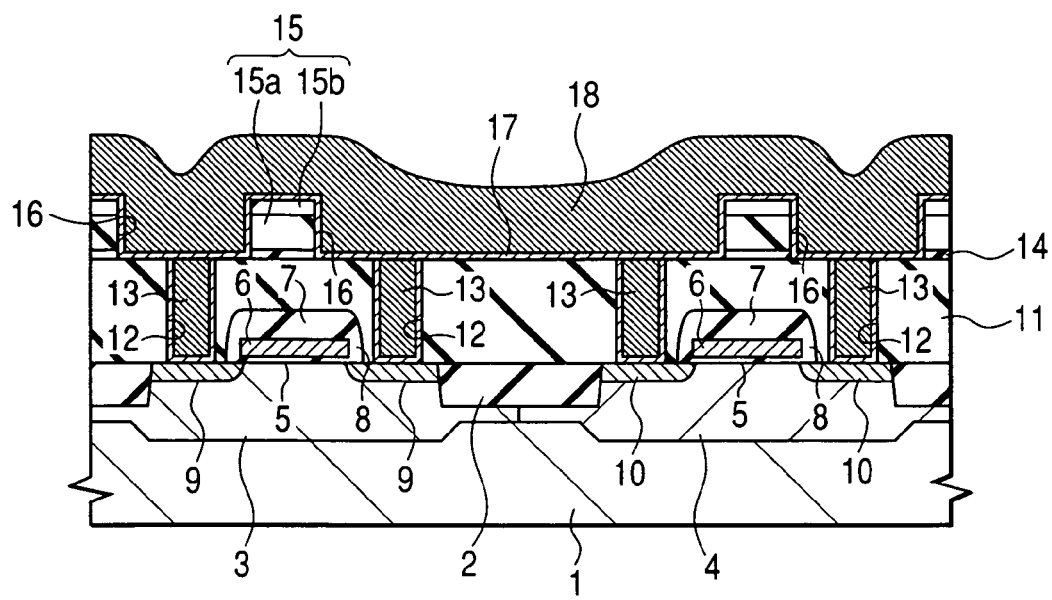
FIG. 11 is a fragmentary cross-sectional view of a semiconductor substrate illustrating a manufacturing step of a CMOS device according to the first embodiment of the present invention.

As illustrated in FIG. 11, by etching with a resist pattern formed by photolithography as a mask, a wiring trench 16 is then formed in a predetermined region of the stopper insulating film 14 and the interlayer dielectric film 15.

A barrier metal layer 17 is laid over the entire surface of the semiconductor substrate 1 including the inside of the wiring trench 16. This barrier metal layer 17 is made of, for example, a tantalum film and it has a thickness of about 50 nm on the flat surface of the substrate. The tantalum film is formed, for example, by sputtering. The barrier metal layer 17 may be composed of a titanium nitride film or tantalum nitride film. Over the barrier metal layer 17, a copper seed layer is formed, for example, by CVD or sputtering, followed by the formation of a copper film 18 thereover, for example, by electroplating.

Figure 12:
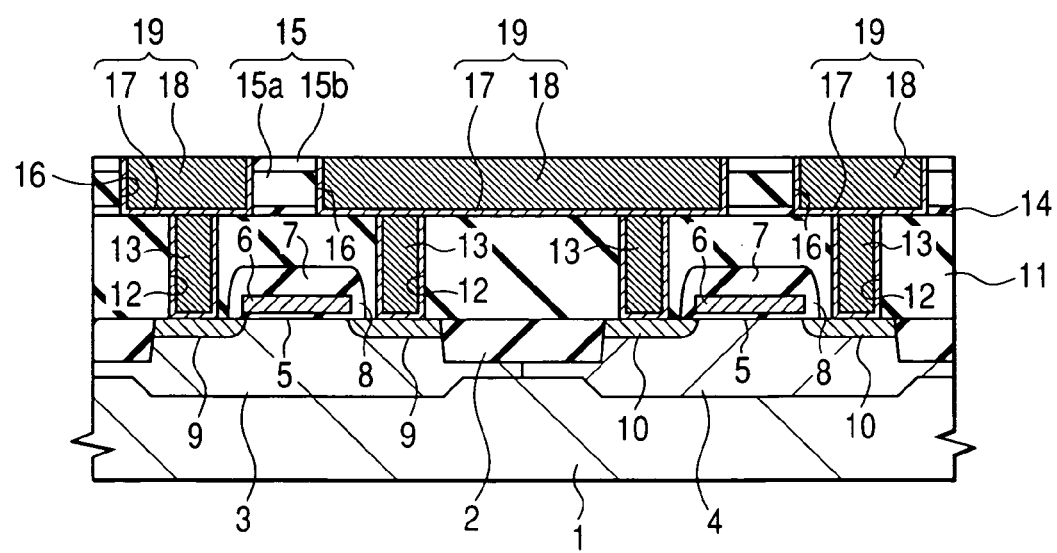
FIG. 12 is a fragmentary cross-sectional view of a semiconductor substrate illustrating a manufacturing step of the CMOS device according to the first embodiment of the present invention.

As illustrated in FIG. 12, the copper film 18 and seed layer are polished by CMP. Polishing is continued further and the barrier metal layer 17 on the interlayer dielectric film 15 is removed, whereby the copper film 18 (including the seed layer) and barrier metal layer 17 are removed from a region other than the wiring trench 16 to form a first-level wiring 19.

In this embodiment, good adhesion between the TEOS film 15b and SiOC film 15a constituting the interlayer dielectric film 15 and good adhesion between the SiOC film 15a and stopper insulating film 14 are attained by the adoption of a SiOC film having a Si—CH$_3$/Si—O bond ratio less than 2.50% as the SiOC film constituting the wiring insulating film 15. In the CMP step of the copper film 18 (including the seed layer) and barrier metal layer 17, therefore, almost no delamination occurs at the interface between the TEOS film 15b and SiOC film 15a constituting the interlayer dielectric film 15 and at the interface between the SiOC film 15 and stopper insulating film 14.

Figure 13:
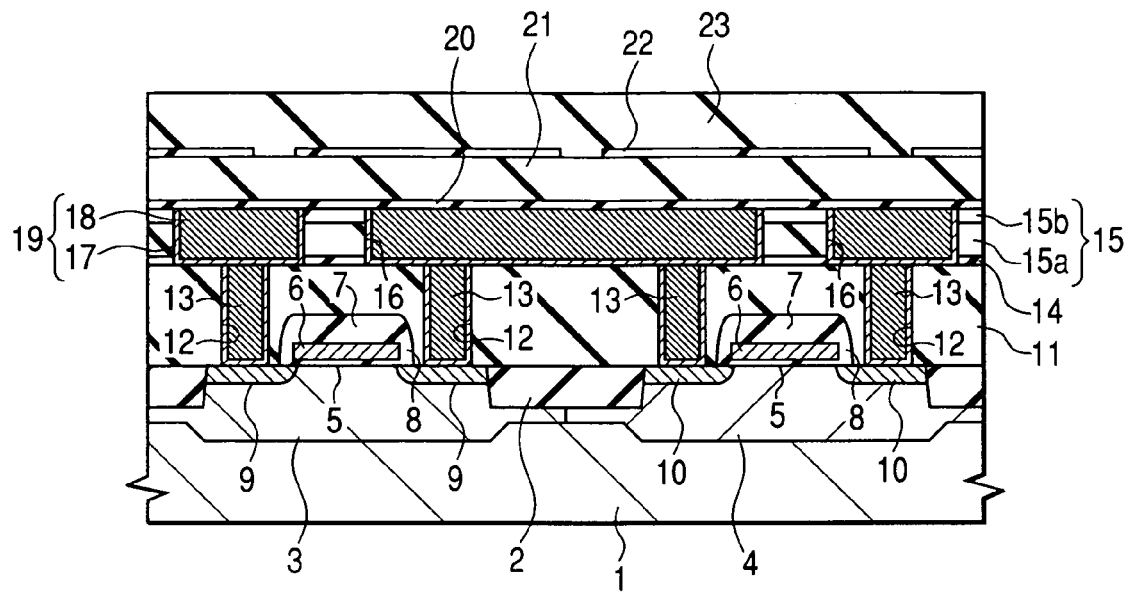
FIG. 13 is a fragmentary cross-sectional view of a semiconductor substrate illustrating a manufacturing step of the CMOS device according to the first embodiment of the present invention.

A second-level wiring is then formed by the dual damascene process. First, as illustrated in FIG. 13, a cap insulating film 20, an insulating film in which connecting holes are to be formed (which insulating film will hereinafter be called "via interlayer film") 21 and a stopper insulating film 22 for wiring formation are formed successively over the first-level wiring 19. The cap insulating film 20 has a function of preventing diffusion of copper. It is made of a material having an etching selectivity sufficiently different from that of the via interlayer film 21 and is also used as an etching stopper when the connecting holes are formed in the via interlayer film 21. The cap insulating film 20 is made of, for example, a SiC film, SiN film or SiCN film and its thickness is, for example, about 5 nm.

The via interlayer film 21 is made of a SIOC film. The SIOC film is formed, for example, by plasma CVD under film forming conditions similar to those employed for the formation of the SIOC film 15a constituting the interlayer dielectric film 15. The via interlayer film 21 may be a film stack similar to that of the interlayer dielectric film 15 obtained by depositing a TEOS film over the SIOC film.

The stopper insulating film 22 is made of an insulation material having an etching selectivity sufficiently different from that of the via interlayer film 21 and an interlayer dielectric film to be deposited over the stopper insulating film 22 later. It is, for example, a SiC film, SiN film or SiCN film and has a thickness of, for example, about 5 nm.

A photoresist film having hole patterns is formed over the stopper insulating film 22 and with this photoresist film as a mask, the stopper insulating film 22 is etched.

An interlayer dielectric film 23 is then formed over the stopper insulating film 22. The interlayer dielectric film 23 is made of a SIOC film and this SIOC film is formed, for example, by plasma CVD under film forming conditions substantially similar to those employed for the formation of the SIOC film 15a constituting the interlayer dielectric film 15. The interlayer dielectric film 23 may be a film stack similar to that of the interlayer dielectric film 15 obtained by depositing a TEOS film over the SIOC film.

Figure 14:
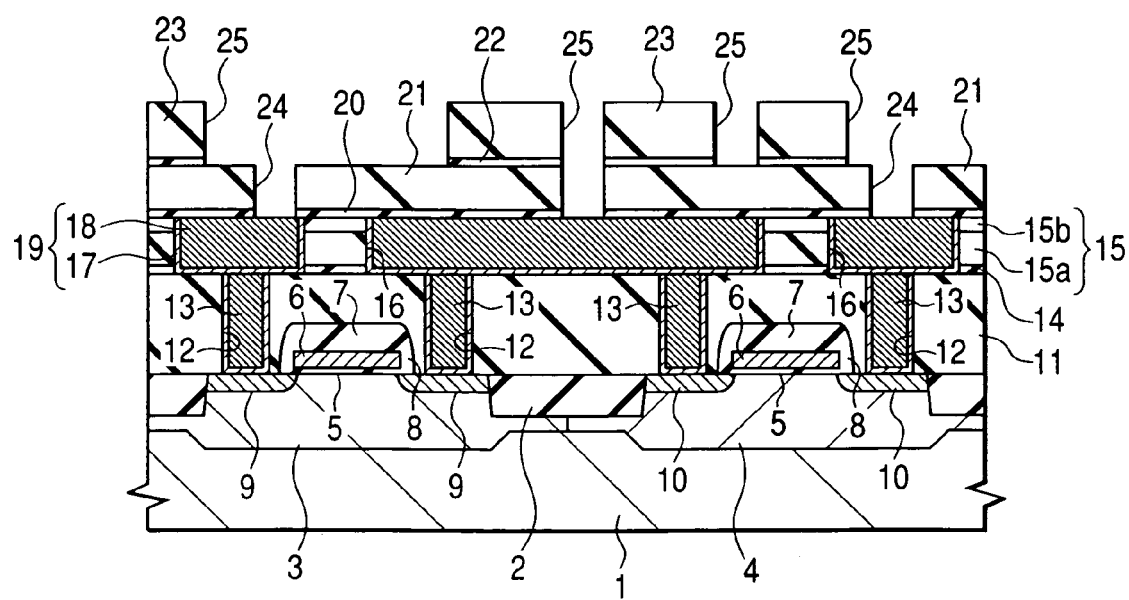
FIG. 14 is a fragmentary cross-sectional view of a semiconductor substrate illustrating a manufacturing step of the CMOS device according to the first embodiment of the present invention.

As illustrated in FIG. 14, a photoresist film having trench patterns is then formed over the interlayer dielectric film 23. With this photoresist film as a mask, the interlayer dielectric film 23 is etched. During this etching, the stopper insulating film 22 serves as an etching stopper. With the photoresist film and stopper insulating film 22 as a mask, the via interlayer film 21 is etched. During this etching, the cap insulating film 20 serves as an etching stopper.

The exposed cap insulating film 20 is removed, for example, by dry etching. Simultaneously with the removal of the cap insulating film 20, the stopper insulating film 22 is removed, connecting holes 24 are formed in the cap insulating film 20 and via interlayer film 21, and wiring trenches 25 are formed in the stopper insulating film 22 and interlayer dielectric film 23.

Figure 15:
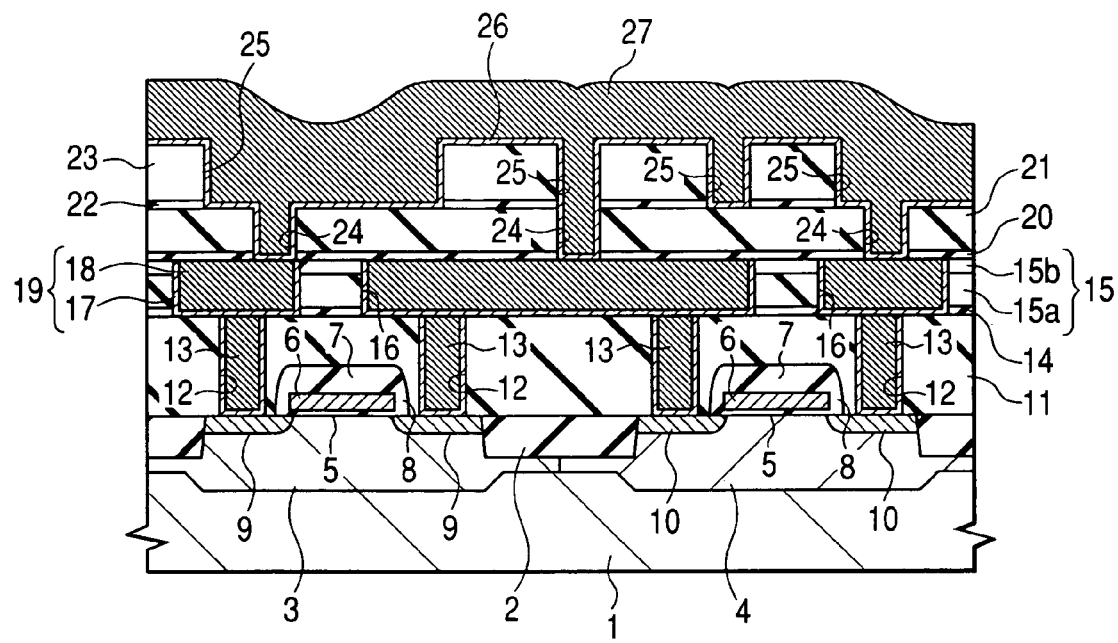
FIG. 15 is a fragmentary cross-sectional view of a semiconductor substrate illustrating a manufacturing step of the CMOS device according to the first embodiment of the present invention.

As illustrated in FIG. 15, a barrier metal layer 26 is formed over the entire surface of the semiconductor substrate 1 including the insides of the connecting holes 24 and wiring trenches 25. The barrier metal layer 26 is made of, for example, a tantalum film and its thickness of about 50 nm on the flat surface of the substrate. The tantalum film is formed, for example, by sputtering. The barrier metal layer 26 may be composed of a titanium nitride film or tantalum film.

Over the barrier metal layer 26, a copper seed layer (not illustrated) is formed, for example, by CVD or sputtering, followed by the formation of a copper film 27 thereover, for example, by electroplating.

Figure 16:
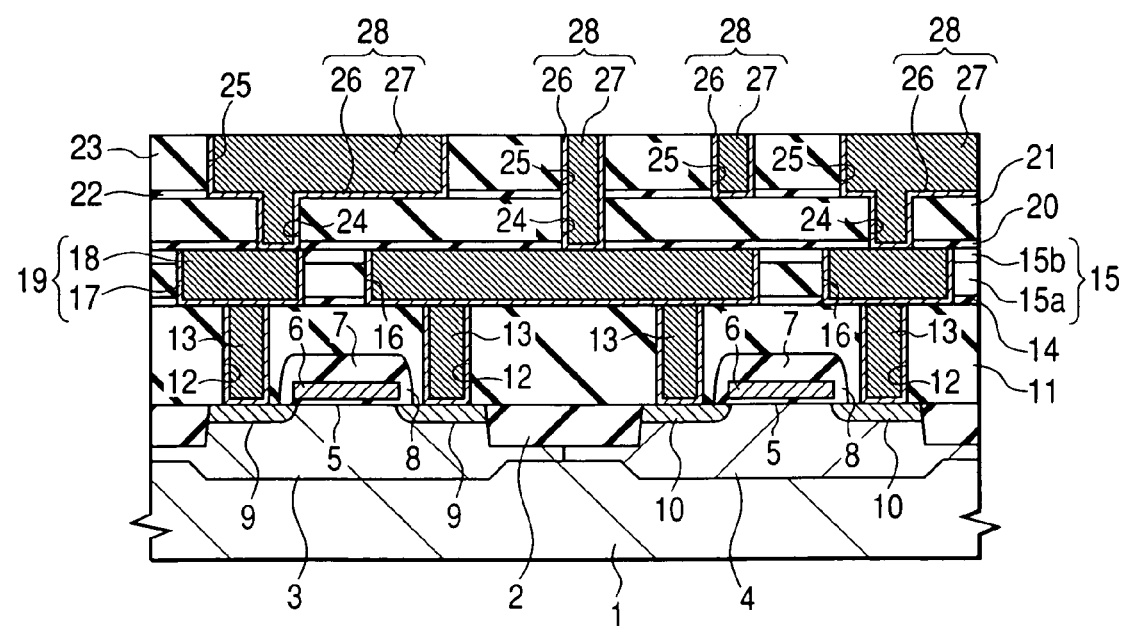
FIG. 16 is a fragmentary cross-sectional view of a semiconductor substrate illustrating a manufacturing step of the CMOS device according to the first embodiment of the present invention.

As illustrated in FIG. 16, the copper film 27 and seed layer are polished by CMP. Polishing is continued further to remove the barrier metal layer 26 over the interlayer dielectric film 23, whereby the copper film 27 (including the seed layer) and barrier metal layer 26 are removed from a region other than the wiring trench 25 and a second-level wiring 28 formed integral with the connecting member is formed.

In this Embodiment, since a SiOC film having a Si—CH$_3$/Si—O bond ratio less than 2.50% is used as the SiOC film constituting the via interlayer film 21 and interlayer dielectric film 23 so that good adhesion is attained between the SiOC film and various films in contact therewith. In the CMP step of the copper film 27 (including the seed layer) and barrier metal layer 26, similar to the CMP step of the copper film 18 (including the seed layer) and barrier metal layer 17, almost no delamination occurs at the interface between the cap insulating film 20 and via interlayer film 21, interface between the via interlayer film 21 and stopper insulating film 22, and interface between the stopper insulating film 22 and interlayer dielectric film 23. Moreover, the interlayer dielectric film 23 is almost free from delamination and boring.

A cap insulating film is then formed over the second-level wiring 28, which is however not illustrated. After formation of third- or greater- level wirings, the entire surface of the semiconductor substrate 1 is covered with a passivation film, whereby a CMOS device is substantially completed.

Next, steps from dicing of the semiconductor wafer having the above-descried CMOS device fabricated on the main surface (circuit formation surface) of the semiconductor substrate 1 into individual chips until the mounting of each chip on a mounting board will be described.

First, it is tested whether the individual chips prepared on the semiconductor wafer are good or defective. For example, the semiconductor wafer is mounted on a measuring stage. When a signal waveform is inputted from an input terminal by bringing a probe into contact with an electrode pad on the circuit formation surface having the CMOS device formed thereon, a signal waveform is outputted from an output terminal. A tester reads the signal waveform thus outputted and judges whether the chip is good or defective. A chip judged defective is identified with a defective mark.

After a protecting tape is adhered to the circuit formation surface of the semiconductor wafer, the back surface (surface opposite to the circuit formation surface) of the semiconductor wafer is roughly polished by a grinder to decrease the thickness of the semiconductor wafer to a predetermined thickness. By finish polishing, the strain on the back surface of the semiconductor wafer caused by the rough polishing is removed. Since the protecting tape is adhered to the circuit formation surface of the semiconductor wafer, there is no fear of the integrated circuit being destroyed. The polishing streaks which have appeared on the back surface of the semiconductor wafer as a result of rough polishing and finish polishing may be removed thereafter.

A dicing tape fixed to a ring-shaped flame is adhered to the back surface of the semiconductor wafer and then, the protecting tape is pealed off. The protecting tape is replaced with the dicing tape, because in order to carry out dicing with reference to the alignment mark formed on the circuit formation surface of the semiconductor wafer in the dicing step later on, the circuit formation surface having an alignment mark formed thereon must be treated as an upper surface.

Figure 17:
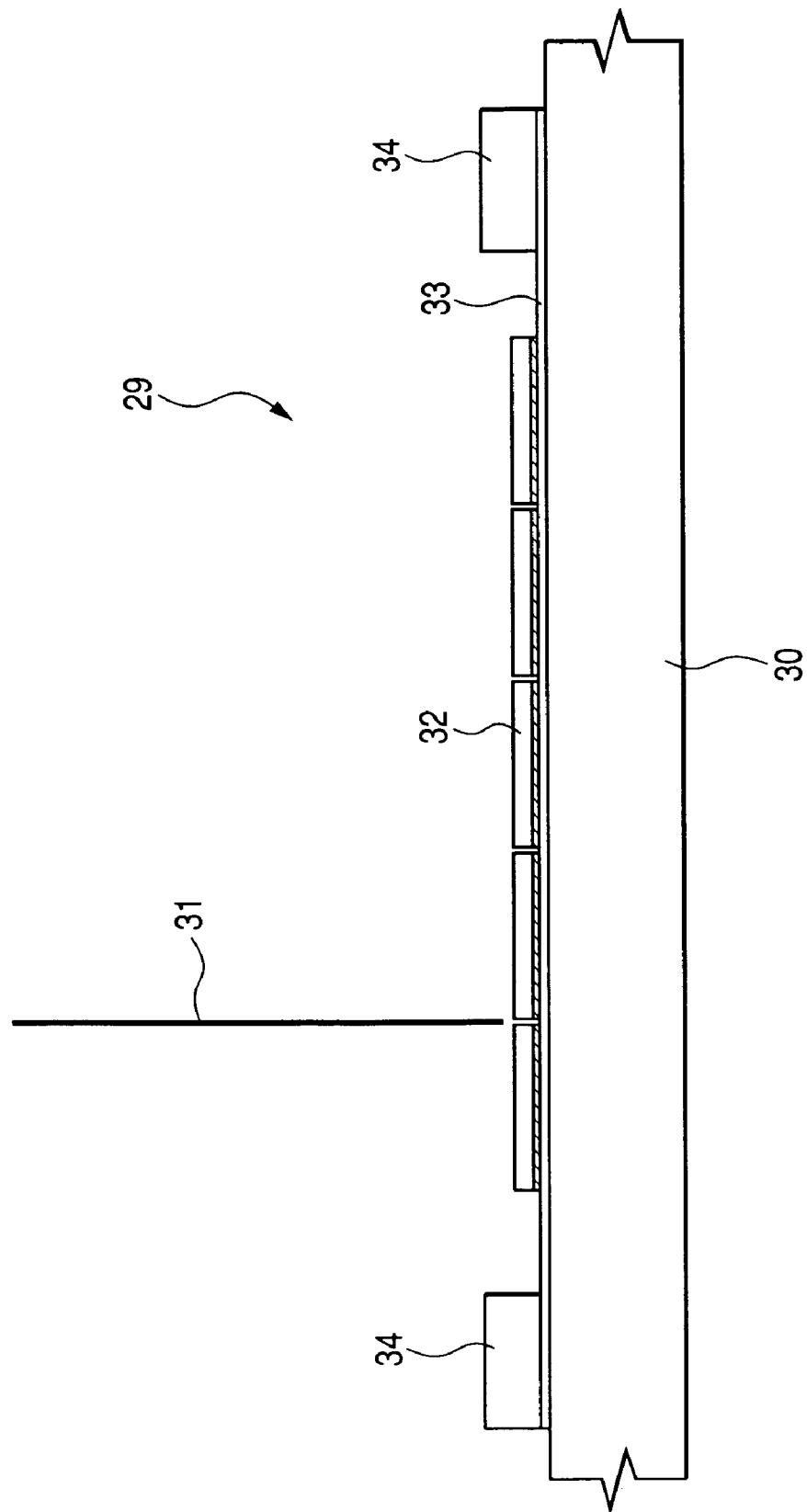
FIG. 17 is a fragmentary cross-sectional view illustrating a dicing step of a semiconductor substrate according to the first embodiment of the present invention.

As illustrated in FIG. 17, the semiconductor wafer is transported to a dicing device 29. After it is mounted on a dicing table 30, the semiconductor wafer is cut horizontally and vertically along scribe lines by an ultra-thin circular blade 31, which is called "diamond saw", having diamond fine particles attached thereto. The semiconductor wafer is diced into chips 32, but even after dicing, the chips 32 are fixed to the flame 34 via the dicing tape 33 so that the arranged state is still maintained.

In this dicing step, a stress is applied to the SiOC film constituting the interlayer dielectric film 15, 23, or via interlayer film 21. In this embodiment, however, the SiOC film has a Si—CH$_3$/Si—O bond ratio less than 2.50% so that it is possible to prevent cracks of the SiOC film and avoid delamination which will otherwise occur at the interface between the SiOC film and another insulating film stacked thereover.

The dicing tape 33 is then exposed to UV rays from the back surface thereof to reduce the adhesive force of the surface of the dicing tape 33 in contact with the chips 32. The chips 32 judged good are pushed by a pushup pin to release the chips 32 from the dicing tape 33. Then, the chips 32 are separated one by one from the dicing tape 33 and picked up through vacuum suction of the circuit formation surface of the released chip 32 by a collet. Each chip 32 thus picked up is then vacuum sucked and retained by the collet and mounted on a predetermined position of a mounting board.

Electrodes on the chip 32 and electrodes on the mounting board are connected electrically and, further, the chip 32 is sealed with a molding resin and protected. Successively, a product name or the like is stamped on the molding resin and from the mounting board, each chip 32 is separated. The finished chips 32 conforming to the classification standards for products are classified and they are completed as products after an inspection step.

In this embodiment, a CMOS device is used as an example of a semiconductor element formed over the main surface of the semiconductor substrate 1, but the present invention is not limited thereto. In addition, two wiring layers are formed over the main surface of the semiconductor substrate 1 in this embodiment, but the present invention can also be applied to an interlayer film for electrically isolating two vertically or horizontally adjacent wirings in another embodiment in which a single-layer wiring or three- or greater-layer wirings are formed.

Moreover, in this embodiment, when the second-level wiring 28 is formed by the dual damascene process, after the formation of hole patterns in the stopper insulating film 22 in advance, the connecting holes 24 and the wiring trenches 25 are simultaneously formed in the via interlayer film 21 and interlayer dielectric film 23 respectively while causing the cap insulating film 20 and stopper insulating film 22 to serve as an etching stopper. The formation method of them is not limited to it. For example, after formation of the connecting holes 24 in the interlayer dielectric film 23 and via interlayer film 21 by etching with a photoresist film, having hole patterns formed therein, as a mask, wiring trenches 25 may be formed in the interlayer dielectric film 23 by etching with a photoresist film, having trench patterns formed therein, as a mask; or after formation of the wiring trenches 25 in the interlayer dielectric film 23 by etching with a photoresist film, having trench patterns formed therein, as a mask, connecting holes 24 may be formed in the via interlayer film 21 by etching with a photoresist mask, having hole patterns formed therein, as a mask.

In this embodiment, the SiOC film used as an interlayer film is defined by a Si—CH$_3$/Si—O bond ratio, the film can be defined not only by the above-described ratio but also by a ratio of a peak strength of a Si—OH bond or Si—H bond to a peak strength of a Si—O bond.

Figure 18:
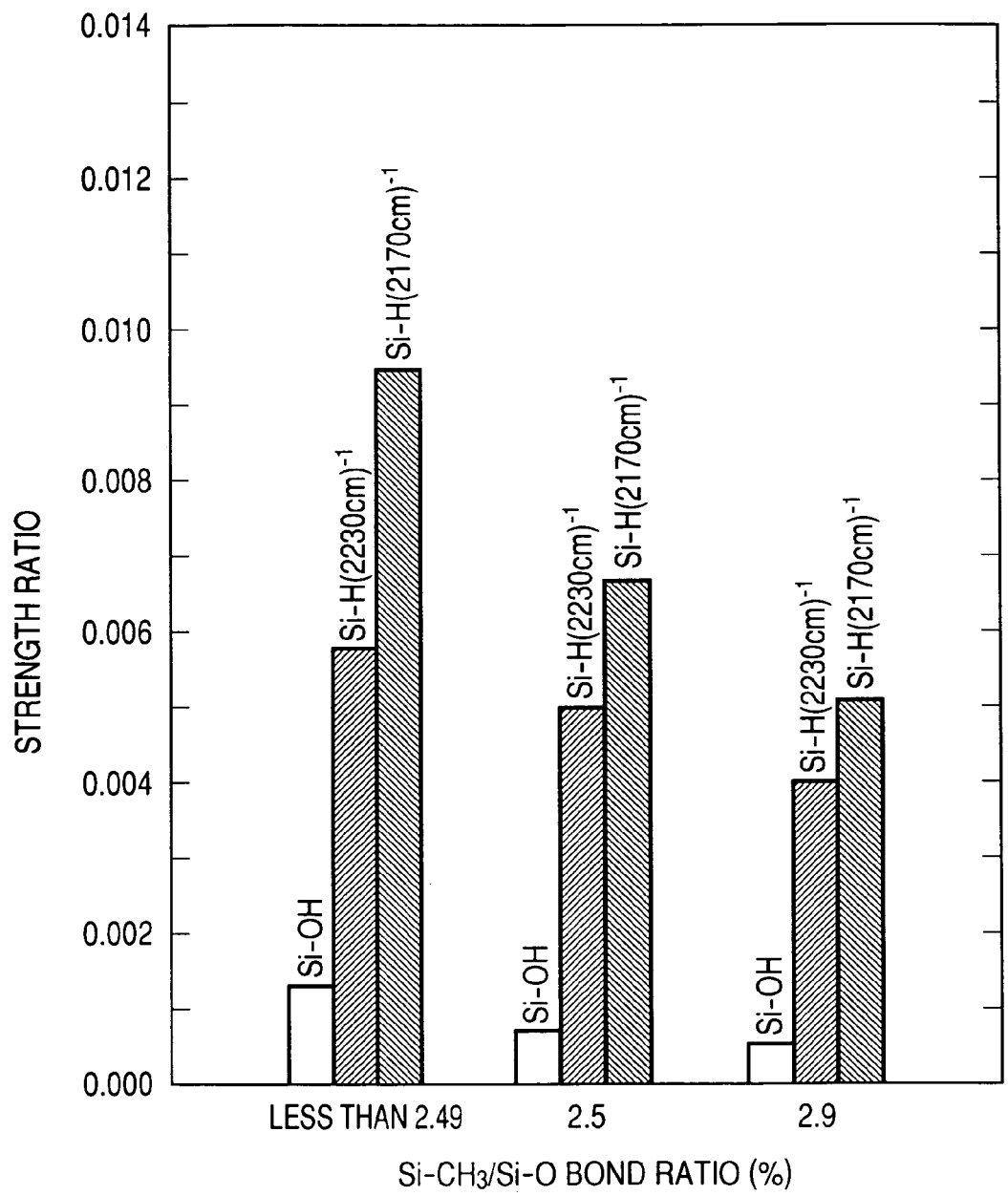
FIG. 18 is a graph illustrating the results of the Si—CH$_3$/Si—O bond ratio and ratio of a peak strength of each bond to a peak strength of a Si—O bond, each of a SiCO film according to the first embodiment of the present invention.

FIG. 18 shows a Si—CH$_3$/Si—O bond ratio of a SiCO film and a ratio of a peak strength of each bond (Si—OH bond, Si—H bond (wavelength: 2230 cm$^{-1}$) and Si—H bond (wavelength: 2170 cm$^{-1}$) to a peak strength of a Si—O bond. The Si—H bond has strong peaks at two wavelengths, that is, at 2170 cm$^{-1}$ and 2230 cm$^{-1}$ in the FT-IR so that it can be defined by the peak strength ratio at two wavelengths.

In the SiOC film having a Si—CH$_3$/Si—O bond ratio of 2.49% or less, a ratio of a peak strength of a Si—OH bond to a peak strength of a Si—O bond (which will hereinafter be called "strength ratio of Si—OH bond") is 0.0013; in the SiOC film having a Si—CH$_3$/Si—O bond ratio of 2.50%, a strength ratio of a Si—OH bond is 0.0007; and in the SiOC film having a Si—CH$_3$/Si—O bond ratio of 2.90%, a strength ratio of a SiOH bond is 0.0005. In the SiOC film having a Si—CH$_3$/Si—O bond ratio not greater than 2.49%, a ratio of a peak strength of a Si—H bond (wavelength: 2230 cm$^{-1}$) to a peak strength of a Si—O bond (which will hereinafter be called "strength ratio of a Si—H bond (2230 cm$^{-1}$)") is 0.0058; in the SiOC film having a Si—CH$_3$/Si—O bond ratio of 2.50%, a strength ratio of a Si—H bond (2230 cm$^{-1}$) is 0.0050; and in the SiOC film having a Si—CH$_3$/Si—O bond ratio of 2.90%, a strength ratio of a Si—H bond (2230 cm$^{-1}$) is 0.0040. In the SiOC film having a Si—CH$_3$/Si—O bond ratio not greater than 2.49%, a ratio of a peak strength of a Si—H bond (wavelength: 2170 cm$^{-1}$) to a peak strength of a Si—O bond (which will hereinafter be called "strength ratio of a Si—H bond (2170 cm$^{-1}$)") is 0.0095; in the SiOC film having a Si—CH$_3$/Si—O bond ratio of 2.50%, a strength ratio of a Si—H bond (2170 cm$^{-1}$) is 0.0067; and in the SiOC film having a Si—CH$_3$/Si—O bond ratio of 2.90%, a strength ratio of a Si—H bond (2170 cm$^{-1}$) is 0.0051.

It is therefore possible to use, as an interlayer film, a SiOC film having a strength ratio of a Si—OH bond exceeding 0.0007, a strength ratio of a Si—H bond (2230 cm$^{-1}$) exceeding 0.0050 or a strength ratio of a Si—H bond (2170 cm$_{-1}$) exceeding 0.0067.

According to this embodiment, it is thus possible to attain a desired relative dielectric constant and at the same time, to suppress lowering in the hardness or elastic modulus, thereby attaining an improvement in the mechanical strength of a SiOC film by defining a Si—CH$_3$/Si—O bond ratio of the SiOC film or by defining a ratio of a peak strength of a Si—OH bond or Si—H bond to a peak strength of Si—O bond. This makes it possible to avoid problems such as boring of the SiOC film constituting the interlayer dielectric film 15, 23, or via interlayer film 21, or delamination at the interface between the SiOC film and another insulating film stacked thereover when metal materials constituting the damascene wiring, for example, copper films 18 and 27, and barrier metal films 17 and 26 are polished by CMP. In addition, it is possible to avoid problems such as cracks of the SiOC film or delamination tendency at the interface between the SiOC film and another insulating film stacked thereover, which will otherwise occur when the semiconductor wafer is diced into individual chips 32 after substantial completion of the formation of a circuit pattern on the semiconductor substrate 1. Such advantages result in an improvement in the reliability of the semiconductor device using a SiOC film as an interlayer film and moreover, improvement in the production yield of the semiconductor device. In addition, contamination of semiconductor manufacturing equipment due to delamination or the like can be reduced, which leads to an increase in the operation efficiency of the semiconductor manufacturing equipment and moreover a cost reduction of semiconductor products.

The invention made by the present inventors was described specifically based on the embodiment of the invention. It will however be apparent that the invention is not limited to the embodiment described above but can be changed variously within a scope not departing from the gist thereof.

For example, in the above-described embodiment, a SiOC film was applied to a interlayer dielectric film or via interlayer film of the damascene wiring, but it can be applied not only to such an interlayer film but also to an interlayer insulating film which is made of a SiOC film and formed over a wiring made of a metal material such as aluminum alloy or a refractory metal film such as tungsten by using, for example, lithography and dry etching.

The manufacturing method of a semiconductor device according to the present invention can be applied to a semiconductor device using a SiOC film as an interlayer film.

The invention claimed is:

1. A manufacturing method of a semiconductor device, which comprises forming a single-layer or multilayer wiring made of a metal material over a semiconductor substrate, wherein:
   an interlayer film for electrically isolating two adjacent wirings is formed from a SiOC film that is formed under a pressure between 400 and 600 Pa: and
   a ratio of a Si—CH$_3$ bond to a Si—O bond of the SiOC film as determined by FT-IR is less than 2.50%.

2. A manufacturing method of a semiconductor device according to claim 1, wherein the ratio of a Si—CH$_3$ bond to a Si—O bond of the SiOC film falls within a range of 2.05 to 2.49%.

3. A manufacturing method of a semiconductor device according to claim 1, wherein the SiOC film has a relative dielectric constant of 3 or less.

4. A manufacturing method of a semiconductor device according to claim 1, wherein the SiOC film has a hardness of 2.8 Gpa or greater.

5. A manufacturing method of a semiconductor device according to claim 1, wherein the SiOC film has an elastic modulus of 18 Gpa or greater.

6. A manufacturing method of a semiconductor device according to claim 1, wherein the SiOC film is formed by plasma CVD method.

7. A manufacturing method of a semiconductor device according to claim 6, wherein the SiOC film is formed under the following film forming conditions: DMDMOS flow rate between 200 and 350 sccm, He flow rate between 100 and 200 sccm, RF power of 3000 to 4000W and substrate temperature between 350 and 400° C.

8. A manufacturing method of a semiconductor device according to claim 1, wherein the wiring is damascene wiring having copper as a main conductor layer.

9. A manufacturing method of a semiconductor device according to claim 1, wherein the ratio of Si—CH$_3$ bond to Si—O bond of the SiOC film falls within a range of 2.30 to 2.40%.

10. A manufacturing method of a semiconductor device according to claim 1, wherein the SiOC film has a strength ratio of a Si—OH bond to a SiO—O bond exceeding 0.0007, a strength ratio of a Si—H bond to a SiO—O bond at a wavelength of 2230 cm$^{-1}$ exceeding 0.0050 and a strength ratio of a Si—H bond to a SiO—O bond at a wavelength of 2170 cm$^{-1}$ exceeding 0.0067, each determined by the FT-IR.

* * * * *